United States Patent [19]
Dewitt

[11] Patent Number: 4,633,097
[45] Date of Patent: Dec. 30, 1986

[54] CLOCK MONITOR CIRCUIT AND METHOD

[75] Inventor: B. Chris Dewitt, Austin, Tex.

[73] Assignee: Motorola, Inc., Schaumburg, Ill.

[21] Appl. No.: 552,885

[22] Filed: Nov. 17, 1983

[51] Int. Cl.[4] .......................... H03K 5/13; H03K 5/19; H03K 17/56

[52] U.S. Cl. ..................................... 307/269; 307/443; 307/517; 307/234; 307/246; 328/120

[58] Field of Search ............... 307/443, 448, 453, 480, 307/481, 517, 518, 522, 234, 246, 572, 573, 265, 269; 328/120, 140, 138

[56] References Cited

U.S. PATENT DOCUMENTS

| | | | |
|---|---|---|---|
| 3,233,118 | 2/1966 | Jensen | 307/518 |
| 3,582,676 | 6/1971 | Rosenbaum | 307/234 |
| 3,624,410 | 11/1971 | Bruckert | 307/234 |
| 4,197,508 | 4/1980 | Takaoka | 307/261 |
| 4,322,642 | 3/1982 | Sugasawa | 328/140 |
| 4,345,209 | 8/1982 | Walker | 328/120 |

*Primary Examiner*—John S. Heyman
*Assistant Examiner*—Timothy P. Callahan
*Attorney, Agent, or Firm*—John A. Fisher; Jeffrey Van Myers

[57] ABSTRACT

A clock monitor circuit and method for providing an indication at the output thereof of the presence of an input clocking signal. If the clock input is operating properly, two charge storage nodes will be charged and the output of the circuit will be high. If the clock input is stuck, the output of the clock monitor circuit will be low.

2 Claims, 1 Drawing Figure

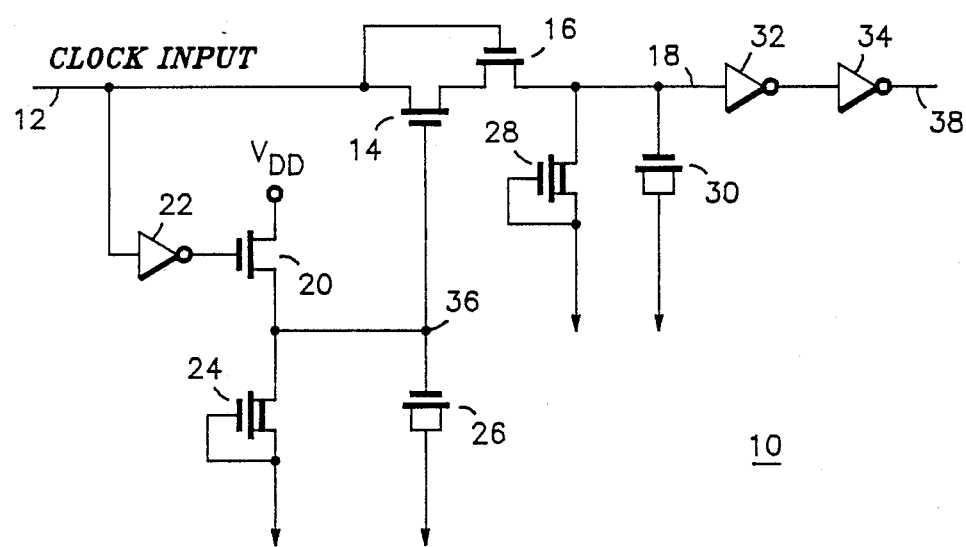

CLOCK MONITOR CIRCUIT AND METHOD

BACKGROUND OF THE INVENTION

The present invention relates, in general, to a clock monitor circuit and method. More particularly, the present invention relates to an integrated circuit and method for monitoring an input clock signal and providing an indication of the loss thereof to a microprocessor (MPU).

In an MPU controlled system, loss of an input clocking signal to the MPU may result in undesirable continued operation. This continued operation despite the loss of the clocking signal will, in turn, result in erroneous system operation which, in certain instances such as automotive or aircraft applications, could have potentially disastrous ramifications. Therefore, it is highly desirable to closely monitor the input clock signal to insure reliable system operation.

In this regard, there has been described a "Clock Failure Monitor Circuit Employing Counter Pair to Indicate Clock Failure Within Two Pulses", U.S. Pat. No. 4,374,361 issuing to Holden on Feb. 15, 1983. However, the system therein described is unduly complex, depending as it does on several different inputs and the use of six JK flip-flops. By the use of such circuitry, the device therein described is also not readily integratable with the microprocessing unit itself.

SUMMARY OF THE INVENTION

It is therefore an object of the present invention to provide an improved clock monitor circuit and method.

It is still further an object of the present invention to provide an improved clock monitor circuit and method which is readily and inexpensively effectuated utilizing a minimum of components.

It is still further an object of the present invention to provide an improved clock monitor circuit and method which may be readily integrated with the MPU itself, utilizing a minimum of on-chip area.

The foregoing and other objects are achieved in the present invention wherein there is provided an integrated circuit including a monitor circuit providing an indication at an output thereof of the presence of an input clocking signal which comprises first and second series connected switching devices coupling the input clocking signal to a first charge storage node coupled to the output. First means are responsive to a first level of the input clocking signal for charging a second charge storage node for enabling the first switching device. Second means are provided responsive to a second level of the clocking signal for enabling the second switching device and charging the first charge storage node while the first switching device remains enabled. In operation, the output maintains a first signal level when the input clocking signal is present and a second signal level when the clocking signal is not present.

BRIEF DESCRIPTION OF THE DRAWING

The above-mentioned and other features and objects of the invention and the manner of attaining them will become more apparent and the invention itself will be best understood by reference to the following description of an embodiment of the invention taken in conjunction with the accompanying drawing, wherein:

the single FIGURE illustrates a logic flow diagram of an integrated clock monitor circuit in accordance with the present invention.

DESCRIPTION OF A PREFERRED EMBODIMENT

With reference to the FIGURE, a clock monitor circuit 10 in accordance with the present invention is shown. Clock monitor circuit 10 includes an input line 12 for receiving a clocking signal. Input line 12 is connected to the input of inverter 22, the drain terminal of transistor 14 and the gate terminal of transistor 16. The output of inverter 22 is applied to the gate of transistor 20 having its drain terminal connected to a source of $V_{DD}$. The source terminal of transistor 20 is connected to the drain of depletion transistor 24, having its gate terminal tied to its source terminal connected to circuit ground. MOS capacitor 26 stores the accumulated charge while depletion transistor 24, acting as a resistor, slowly discharges node 36. Refreshing of the charge stored at node 36 is therefore necessary to keep transistor 14 turned on. Node 36 defines the electrically common connection of the source terminal of transistor 20, the drain terminal of depletion transistor 24, the gate of transistor 14, and one plate of capacitor 26.

Transistor 14 has its source terminal connected to the drain of transistor 16. The source terminal of transistor 16 is connected to node 18 at the input of inverter 32, which, in turn, has its output connected to the input of inverter 34. The output of inverter 34 defines output line 38. Node 18 is connected to the drain terminal of depletion transistor 28, having its gate tied to its source terminal connected to circuit ground. MOS capacitor 30 stores the accumulated charge while depletion transistor 28, acting as a resistor, slowly discharges node 18.

The purpose of clock monitor circuit 10 is to check that the clock input on input line 12 is clocking. If the clock input is operating properly, nodes 36 and 18 will be charged, and the output of inverter 34 on output line 38 will be high. If the clock input is stuck, that is not clocking, the output of inverter 34 on output line 38 will be low.

Nodes 36 and 18 are charge storing nodes and the way they are charged is as follows:

Clock Input Low

When the clock input on input line 12 is low, the output of inverter 22 on the gate of transistor 20 is high, thus turning transistor 20 on. This allows node 36 to charge, which in turn turns on transistor 14.

Clock Input High

When the clock input on input line 12 switches high, transistor 16 is now turned on. Since transistor 14 is held on by the charge stored at node 36, this allows node 18 to be charged through transistors 14 and 16. When node 18 is charged, inverters 32 and 34 switch, with the output of inverter 34 on output line 38 going high. This indicates that the input clocking signal is good. Depletion transistor 24 in combination with MOS capacitor 26 and depletion transistor 28 in conjunction MOS capacitor 30 form RC networks for nodes 36 and 18 respectively. It can be seen, therefore, that it is imperative that the clock input transition repeatly in order that nodes 36 and 18 may be recharged.

It should be noted that the clock input on input line 12 is required to be below about 1 volt to charge node 36 and the clock must transition to above a one volt level to charge node 18. This means that a half level cannot sustain a valid clock indication on output line 38. The repeated charging of nodes 36 and 18 is necessary in order to sustain a valid clock indication on output line 38. The RC time constant of depletion transistor 24 and MOS capacitor 26 as well as depletion transistor 28 and MOS capacitor 30 must be greater than the clock cycle input, in order to achieve and sustain a valid clock indication on output line 38.

In the embodiment above described, transistors 14, 16 and 20 are enhancement devices. Depletion transistor 24 and 28 are shown as depletion devices although an enhancement device having its gate coupled to its drain or a P-channel device would function similarly. MOS capacitors 26 and 30 are likewise shown as depletion devices formed by tying their drain and source terminals together to circuit ground although other configurations using enhancement or P-channel devices would function satisfactorily. It is apparent that, utilizing the circuitry of clock monitor circuit 10 above described, a readily integrated version may be attained. The output indication appearing on output line 38 may be used to cause an internal reset to an MPU to shut down system operation in the event of a clock failure sensed on input line 12. Although in the embodiment above described, two inverters 32, 34 were utilized only a single gain stage comprising inverter 32 may be necessary.

What has been provided, therefore, is an improved clock monitor circuit and method which may be readily integrated with the MPU itself, utilizing a minimum of on-chip area. A clock monitor circuit and method in accordance with the present invention is readily and inexpensively effectuated utilizing a minimum of components.

While there have been described above the principles of the invention in conjunction with specific apparatus, it is to be clearly understood that this description is made only by way of example and not as a limitation to the scope of the invention.

I claim:

1. A clock monitor circuit for providing an output signal indicative of the presence of a clock signal which oscillates between first and second predetermined voltage levels, said monitor circuit comprising:
    first charge storage means;
    charging means, coupled to said first charge storage means and for receiving said clock signal, said charging means charging said first charge storage means at a first predetermined rate when said clock signal is at said first voltage level;
    first discharging means, coupled to said first charge storage means, for continuously discharging said first charge storage means at a second predetermined rate which is less than said first predetermined rate;
    first coupling means for receiving said clock signal and coupled to said first charge storage means, said first coupling means coupling said clock signal to a second node when the voltage on said first charge storage means exceeds a predetermined threshold voltage level;
    second charge storage means;
    second coupling means for receiving said clock signal and coupled to said second node, said second coupling means coupling said second node to said second charge storage means when said clock signal is at said second predetermined voltage level, said second charge storage means being charged by said clock signal via said second node;
    second discharging means, coupled to said second charge storage means, for continuously discharging said second charge storage means at a third predetermined rate independent of said first and second predetermined rates; and
    buffer means for providing an output signal indicative of the voltage on said second charge storage means.

2. A clock monitoring method for providing an output signal indicative of the presence of a clock signal which oscillates between first and second predetermined voltage levels, said method comprising the steps of:
    charging a first node at a first predetermined rate when said clock signal is at said first voltage level;
    continuously discharging said first node at a second predetermined rate which is less than said first predetermined rate;
    coupling said clock signal to a second node when the voltage on said first node exceeds a predetermined threshold voltage level;
    coupling said second node to a third node when said clock signal is at said second predetermined voltage level, said third node being charged by said clock signal via said second node;
    continuously discharging said third node at a third predetermined rate independent of said first and second predetermined rates; and
    providing an output signal indicative of the voltage on said third node.

* * * * *